(12) United States Patent
Boardman et al.

(10) Patent No.: US 8,343,593 B2
(45) Date of Patent: Jan. 1, 2013

(54) METHOD OF COATING INNER AND OUTER SURFACES OF PIPES FOR THERMAL SOLAR AND OTHER APPLICATIONS

(75) Inventors: William J. Boardman, Danville, CA (US); Thomas B. Casserly, San Ramon, CA (US); Deepak Upadhyaya, Fremont, CA (US); Karthik Boinappaly, Fremont, CA (US); Rahul Ramamurti, Walnut Creek, CA (US)

(73) Assignee: Sub-One Technology, Inc., Pleasanton, CA (US)

( * ) Notice: Subject to any disclaimer, the term of this patent is extended or adjusted under 35 U.S.C. 154(b) by 331 days.

(21) Appl. No.: 12/465,494

(22) Filed: May 13, 2009

(65) Prior Publication Data

US 2009/0311443 A1 Dec. 17, 2009

Related U.S. Application Data

(60) Provisional application No. 61/127,432, filed on May 13, 2008.

(51) Int. Cl.
*C23C 16/448* (2006.01)
(52) U.S. Cl. ......... 427/569; 427/230; 427/237; 118/715
(58) Field of Classification Search ........................ None
See application file for complete search history.

(56) References Cited

U.S. PATENT DOCUMENTS

| | | | |
|---|---|---|---|
| 4,486,462 A * | 12/1984 | Asahi et al. .................. | 427/576 |
| 5,133,986 A | 7/1992 | Blum et al. | |
| 5,302,422 A * | 4/1994 | Nowak et al. ................. | 427/533 |
| 6,129,856 A | 10/2000 | Jung et al. | |
| 7,300,684 B2 | 11/2007 | Boardman et al. | |
| 2004/0038033 A1 * | 2/2004 | Massler et al. ................. | 428/408 |
| 2005/0035085 A1 * | 2/2005 | Stowell et al. .................. | 216/76 |
| 2005/0266163 A1 | 12/2005 | Wortman et al. | |
| 2006/0196419 A1 | 9/2006 | Tudhope et al. | |
| 2007/0084720 A1 * | 4/2007 | Hosokawa et al. ...... | 204/298.16 |
| 2008/0029494 A1 | 2/2008 | Tudhope et al. | |
| 2010/0189559 A1 * | 7/2010 | Sharp et al. ................. | 415/208.1 |

FOREIGN PATENT DOCUMENTS

| | | |
|---|---|---|
| EP | 0 064 884 A1 | 11/1982 |
| GB | 2030180 A | 4/1980 |
| JP | 63026373 * | 2/1988 |

OTHER PUBLICATIONS

Yasuyuki, JP63-026373, English abstract, Feb. 1988.*
Yasuyuki, JP63026373, Feb. 1988—Human English translation.*
Article titled Thick DLC Films Deposted by PECVD on the Internal Surface of Clindrical Substrates by D. Lusk et al ., Jan. 2008.

* cited by examiner

*Primary Examiner* — Joseph Miller, Jr.
(74) *Attorney, Agent, or Firm* — Schneck & Schneck; David M. Schneck

(57) ABSTRACT

A method of coating at least one exterior surface of at least one workpiece is disclosed. The method may be used for coating inner and outer surfaces of pipes. A hollow workpiece is positioned within a chamber. A spacing between a multi-dimensional interior surface of the chamber and an exterior surface of the workpiece is fixed. Conditions are established to maintain a hollow cathode effect within the spacing and within the hollow workpiece. The conditions include biasing anodes at opposite ends of a hollow cathode effect region, and biasing the interior surface of the chamber and the workpiece as cathodes. The interior surface and the workpiece may be maintained at a common bias voltage or, in at least one embodiment, at differing voltages.

17 Claims, 1 Drawing Sheet

METHOD OF COATING INNER AND OUTER SURFACES OF PIPES FOR THERMAL SOLAR AND OTHER APPLICATIONS

CROSS-REFERENCE TO RELATED APPLICATION

This application claims priority from provisional application Ser. No. 61/127,432, filed May 13, 2008.

TECHNICAL FIELD

This invention describes a method of simultaneously and uniformly coating two internal surfaces and one external surface using high deposition rate hollow cathode techniques. Additionally, the technique teaches a new method for coating the inner and outer surface of a hollow part with two different types of coatings simultaneously.

BACKGROUND ART

Plasma Enhanced Chemical Vapor Deposition (PECVD) methods of coating external surfaces of a workpiece within a vacuum chamber are well known. The coating of internal surfaces of hollow workpieces using PECVD technique is less common but has been described in U.S. Pat. No. 7,300,684 to Boardman et al., which utilizes a high deposition rate PECVD technique. The Boardman et al. patent is incorporated herein by reference. The method involves using the pipe itself as a vacuum chamber, coupling the gas supply to one opening and the vacuum pump to another, and employing a voltage biasing system connected with the negative terminal attached to the pipe and with return anode(s) located at the ends of the pipe. Hydrocarbon precursors can be introduced and the voltage biasing system is used to generate a high density hollow cathode plasma and attract hydrocarbon ions to the surface to from a diamond-like carbon (DLC) film.

In many cases, it is necessary to coat both the internal and external surfaces of a hollow workpiece. Previously, this required the coating of each surface separately using different processing techniques. The method described in U.S. Pat. No. 6,129,856 to Jung et al. describes a method of coating an internal surface which may result in some unintentional coating of the external surface of the tube, since the entire part is contained within a vacuum chamber. While the Jung et al. method has advantages as compared to other approaches, the thickness of the external coating may be non-uniform and may be less than the thickness of the internal coating, as the gas flow is directed through the inside of the hollow body so that most of the gas will be consumed within the tube. Also, the high ion density hollow cathode plasma rapidly decays after exiting the hollow cathode source, which is in proximity to the internal coating.

SUMMARY OF THE INVENTION

A method in accordance with the present invention enables coating of an exterior surface of a workpiece, such that the coating exhibits desired (target) coating properties. In some applications, the exterior surfaces of a number of workpieces are coated simultaneously, such as in the coating of piston rings or similar workpieces. As a first step, a chamber having a multi-dimensional interior surface is provided. The multi-dimensional interior surface has a particular geometry with respect to an axis of the chamber. For example, the chamber may be cylindrical. Each workpiece is positioned within the chamber so that the spacing between the multi-dimensional interior surface and the exterior surface of the workpiece remains substantially fixed along the axial direction of the chamber. Where the workpiece is cylindrical, the workpiece is positioned coaxially within the cylindrical chamber. Conditions are established to maintain a hollow cathode effect within the spacing between the interior surface of the chamber and the exterior surface of the workpiece, thereby defining a hollow cathode effect region. The interior surface of the chamber and the exterior surface of the workpiece are biased as cathodes, but not necessarily at the same biased voltage, while anodes are located at opposite ends of the hollow cathode effect region.

As defined herein, the "hollow cathode effect" occurs when at least two cathode surfaces are positioned opposite to each other and are electrically cooperative with spaced apart anodes, such that an "oscillation motion" of electrons is achieved to increase ionization rates within a plasma. The spacing between the inner chamber wall and the exterior surface of the workpiece is selected so as to control the plasma intensity, as well as plasma focusing. If this spacing is below a desired range, the intense plasma will be too close of the surface being coated, causing intense ion bombardment and heating, so that the quality of the coating will be adversely affected. On the other hand, if the spacing is above the target range, the bias voltages for achieving the hollow cathode effect will need to be high, thereby causing thermal spikes that may result in a poor quality coating. In one embodiment, the desired coating is a diamond-like coating (DLC). Another consideration is the aspect ratio of the length of the hollow cathode effect region to the distance across the hollow cathode effect region. As the length between one of the anodes and the most distance part of the workpiece increases (typically the distance to the center of the workpiece), the distance that an electron must travel increases. The uniformity of the coating thickness is promoted by maintaining this aspect ratio within a given limit, such below the aspect ratio of 50:1.

Particularly if the method is implemented to simultaneously coat a number of workpieces, the workpieces may be supported along a rod that is coaxial with the chamber. However, the method may also be used in simultaneously coating exterior and interior surfaces of a workpiece, such as a tube. Thus, the hollow cathode effect may be established within the tube, as well as within the spacing between the tube and the chamber wall. The coating applied to the interior of the tube may be the same as the coating applied to the exterior or may be different either with respect to coating properties (e.g., thickness) or coating materials.

A system in accordance with the invention may include a large diameter tube that functions as the chamber. A small diameter member is then located coaxially within the large diameter tube, such that the hollow cathode effect region is defined between the small diameter member and the large diameter tube. Anodes are located at opposite sides of this region and a biasing system is connected to bias the anodes and to establish the large diameter tube and the small diameter member as cathodes. A gas supply is connected to provide a flow of reactant gas within the hollow cathode effect region at a pressure that is cooperative with the biasing system to establish the hollow cathode effect.

DETAILED DESCRIPTION

Figure 1:
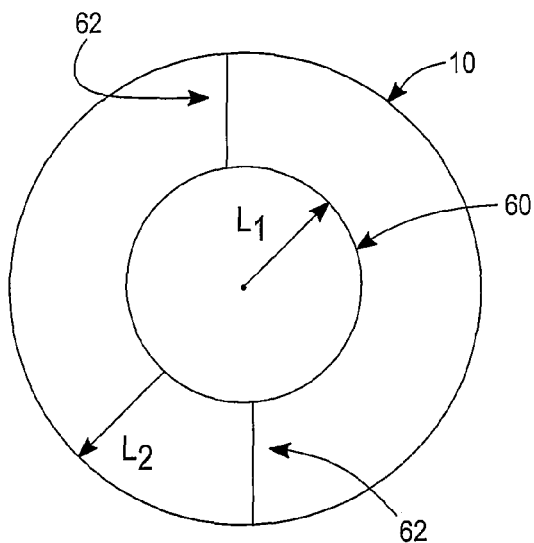
FIG. 1 is a sectional view of concentric workpieces connected in accordance with one application of the invention.
Figure 2:
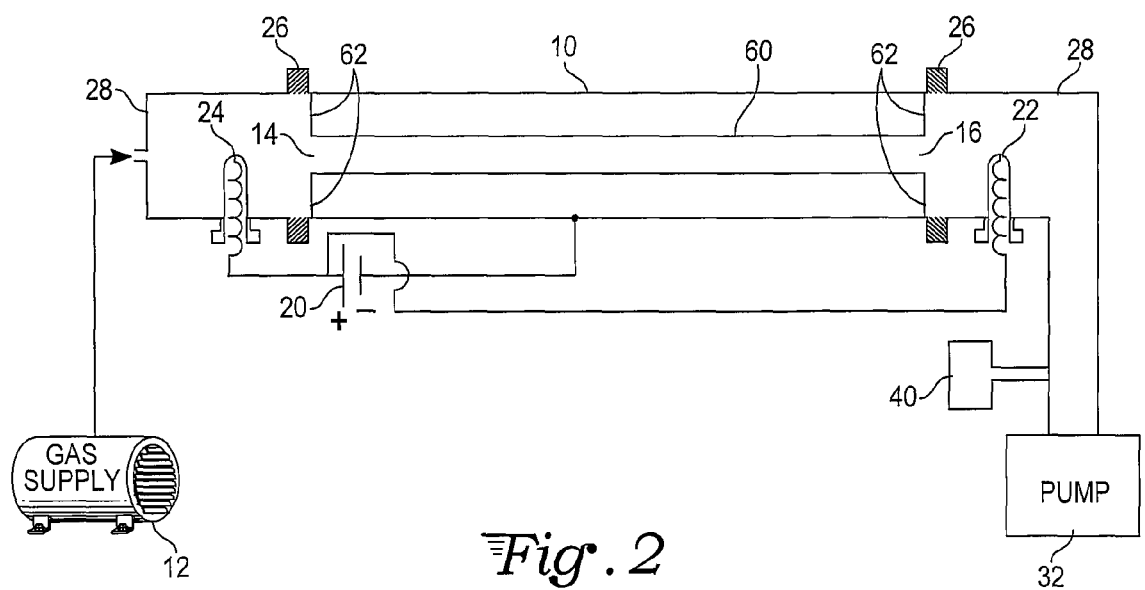
FIG. 2 is a side representation of a system for implementing the invention.

Referencing FIGS. 1 and 2, a voltage biasing system 20 is connected such that the pipes 10 and 60 (or other hollow workpieces) are biased as cathodes with an anode(s) 24 and/or 22 coupled to at least one opening of each pipe. The inner pipe 60 is electrically connected to the outer pipe 10 through at least one electrical connector 62. A source gas is introduced from a gas subsystem 12 that is coupled to at least one opening of the pipe, and gas is exhausted through a pumping subsystem 32 connected to at least one opening of the pipe.

In the illustrated application, three surfaces are coated simultaneously. Specifically, the interior and exterior surfaces of the inner pipe 60 and the interior surface of the outer pipe 10 are coated. In other applications, the outer pipe merely functions as a chamber for coating the inner pipe, so that only one workpiece is significant. As another possibility, the interior surface of the inner pipe is not coated. In fact, the inner pipe may solid. To achieve a uniform coating on all surfaces, the diameter of the inner pipe (L1 in FIG. 1) should be approximately the same as the spacing between the outer pipe and the inner pipe (L2 in FIG. 1), so that a uniform hollow cathode effect (HCE) plasma is obtained in both (the inner and outer) hollow spaces. Alternately, the spacing can be adjusted so that film and deposition properties, such as deposition rate or stress, are optimized for the desired surfaces. A high density plasma results in a high deposition rate, which is beneficial for applications requiring a thick film, such as films that are applied to achieve high corrosion or erosion resistance. A hollow cathode effect plasma as described in this invention results in a deposition rate of between 0.1 and 2.0 um/min or approximately ten times greater than a conventional glow discharge. Applications such as thermal solar collector pipes require precise control of thickness uniformity and optical absorption and infrared transmittance. This uniformity control can be obtained for both inner and outer surfaces if a hollow cathode effect is generated in both the inner and outer pipe.

A conductive pipe or "workpiece" 10 and 60 is connected to a pulsed DC power supply 20, which applies a pulsed negative bias. This negative bias is used to (a) create a plasma between first and second electrodes or between a cathode and an anode, (b) draw an ionized reactive gas to the surfaces to be coated, (c) allow ion bombardment of the film applied to the surface so as to improve film properties such as density and stress levels, and (d) allow control of uniformity by adjustment of the duty cycle so as to simultaneously permit replenishment of a source gas and depletion of positive surface charge buildup, which might otherwise result in arcing on an insulating film such as DLC. The duty cycle is selected to allow the gas replenishment and charge depletion during the "off" portion of the cycle The "hollow cathode effect" as used herein occurs when at least two cathode surfaces are positioned opposite to each other and are electrically cooperative with remote anodes, such that a large increase in current is achieved as compared to a conventional plasma glow. The increase is due to the "oscillation motion" of fast (hot, accelerated) electrons between the opposite space charge sheaths, which enhances the excitation and ionization rates in the plasma several orders higher than in the conventional glow discharge. Because this electron pendulum motion is related to the mean free path of the fast electrons, there is a relationship of the hollow cathode effect to pressure inside the hollow cathode and the spacing between the cathodes. That is, a hollow cathode with a smaller spacing will operate at a higher pressure than a hollow cathode with a larger spacing. It follows that since both the inner and outer pipe 10 and 60 of FIGS. 1 and 2 (or hollow workpieces) are operating at the same pressure, the spacing between the two pipes is preferably approximately the same as the inner pipe diameter (2L1~L2 in FIG. 1). While the invention is illustrated and described with reference to tubes, other multi-dimensional workpieces may be substituted (such as square inner and outer workpieces), if the spacing between the two surfaces is sufficiently uniform to maintain the application of the hollow cathode effect. While some surface irregularities are acceptable (such as a small indentation along the outer surface of a piston ring), the spacing between the two cathodes should be generally constant.

The following definitions and description of the HCE are contained in the publication entitled "Studies of Hollow Cathode Discharges Using Mass Spectrometry and Electrostatic Probe Techniques" by H. S Maciel et al., 12th International Congress on Plasma Physics, 25-29 Oct. 2004, Nice (France). Hollow cathode discharges (HCD) are capable of generating dense plasmas and have been used for development of high-rate, low-pressure, high-efficiency processing machines. The geometric feature of a HCD promotes oscillations of hot electrons inside the cathode, thereby enhancing ionization, ion bombardment of inner walls and other subsequent processes. At the same power, the hollow cathode exhibits plasma density one to two orders of magnitude higher than that of conventional planar electrodes. "It is well known that the product (Pd), of the inter-cathode distance (d) by the pressure (P), is an important parameter to describe the behavior of the HC discharge. Usually, the electron-atom inelastic collision rates are increased by the decrease of the inter-cathode distance with a large effect on the plasma density and electron temperature. The effect of the gas pressure on the discharge properties is expected since the increase of the collisionality by increasing the pressure tends to enhance the hollow cathode effects being possible to reach an optimized reduced inter-cathode distance (Pd)." It will, however, be appreciated that the process described herein may be adopted with plasma being generated adjacent the component to be treated which is not a "hollow cathode" type. Advantage is, however, gained by the employment of such a "hollow cathode."

To further improve charge dissipation, an asymmetric bipolar pulse can be used, with a very small, short positive pulse applied to attract electrons and dissipate any positive charge (without forming a reverse plasma) resulting from the coating process of an insulating coating. Here, the outer pipe 10 functions as a cathode, while anodes 22 and 24 are electrically isolated from the workpiece by insulators 28 but are connected to the positive side of the pulsed DC supply 20. In some embodiments, the components are grounded, or can be floating. Pressure sensors 26 are located at each attachment head so that the pressure in the pipe can be monitored and controlled. The anodes are located near workpiece openings 14 and 16 and are physically and electrically isolated from the conductive workpiece and other functional subsystems by the insulators. The gas supply subsystem 12 and pumping subsystem 32 are coupled to workpiece openings.

In a preferred arrangement, a hydrocarbon precursor is used to form a high $sp^3$ content diamond-like carbon (DLC) film on the exterior surface or both surfaces of a conductive pipe 60, using a PECVD process. A negative pulse bias is applied to the pipe 60, with the anodes 22 and 24 placed at the ends of the pipe. In a desirable optional step, the exterior surface of the workpiece is sputter cleaned and an adhesion promoting layer is deposited as follows. The spacing between the pipes 10 and 60 is pumped to base pressure (~1 mTorr), and Ar is introduced into the spacing. An Ar plasma is generated while a negative pulse bias is applied to the pipes. This negative bias causes ion bombardment and sputter cleaning of the pipe surfaces. Following the Ar cleaning, a silicon-containing adhesion layer is deposited, such that a strong iron-silicide bond is formed to the steel substrate and a SiC bond is formed to the DLC coating when deposited. Tetramethylsilane is introduced via the gas supply 12. Due to the high vapor pressure of this liquid, it can be introduced by the simpler vapor draw technique. In some cases, it may be desirable to use a precursor other then silicon for the adhesion layer, if the metal substrate does not form a strong bond with silicon. The strength of the bond that is formed is indicated by a negative heat of formation of the compound, the larger the negative number the more readily the chemical bond will form thermodynamically.

Following the deposition of the adhesion layer, the DLC film is formed. This is done by injecting the hydrocarbon precursor vapor into the spacing between the two pipes 10 and 60. Where the interior surface of the small diameter pipe is to be coated, vapor is simultaneously injected into this pipe. The pressure may be set using pressure control valve 40 to generate a hollow cathode effect (HCE) plasma for a given diameter hollow cathode effect region having an applied bias voltage and pressure. For example, for a 1.5 inch diameter pipe, a high intensity hollow cathode plasma is generated at 100-300 mTorr with an applied bias of 650V. The pressure setting should be such that the pressure within the spacing between the two pipes establishes a condition in which the electron mean free path is related to the distance L2 between the pipes, such that the electron has sufficient energy to reach the opposing cathode sheath and be reflected back, causing electron oscillation and increased ionizing collisions by the "hollow cathode effect." Thus, a more intense plasma is generated within the workpiece. Since the electron mean free path increases as the pressure decreases, it is necessary to decrease pressure as the spacing L2 increases. For example, a quarter inch (6.35 millimeter) diameter gasline will generate a hollow cathode plasma at a pressure of approximately 200-500 mTorr, while a four inch (101.6 millimeter) diameter pump exhaust duct would generate a plasma at a pressure of approximately 12-100 mTorr. These are intended to be approximate values to show the general trend of lower pressure with larger diameter, but the pressure range can vary significantly from these values and still maintain a hollow cathode effect plasma.

In another embodiment, the invention is used to deposit two different films on the outer and inner surfaces simultaneously. For example, a coating to prevent corrosion and hydrogen permeation (such as a DLC) can be deposited on the inner surface of the inner pipe 60 by introducing a hydrocarbon precursor through a small diameter nozzle directed at the center of the inner pipe, while an optical absorbing coating can be applied to the outer surface of this pipe and the inner surface of the outer pipe by introducing a precursor such as $SiH_4$ and $N_2O$ (to form $SiN_yO_x$) directed toward the space between the inner and outer pipes. This coating can be used for thermal solar applications, where hydrogen permeation should be blocked to prevent degradation of the vacuum established between the inner pipe, which carries the hot thermal oil, and the outer quartz tube. The purpose of this vacuum is to prevent loss of heat due to radiation. An inert push gas such as argon can be introduced upstream of the introduction of the reactive gasses to prevent backdiffusion and, if necessary, a pump port can be introduced between the push gas and the reactive gas.

Utilizing an annular geometry of the hollow cathode enables:
   Coating of the interior surface of one object and the external surface of another;
   The ability to coat, simultaneously, the inner surface of the surrounding object, the external and internal surfaces of the internal object;
   Coating of the external surface only or both internal and external surfaces of a pipe for applications from anti-corrosion, anti-fouling, wear and abrasion resistant films to absorbing, thermally stable, non-outgassing for applications in thermal solar. The use of many precursors and the ability to tune the characteristics of the film;
   Control over the aspect ratio of large diameter tubing by controlling the space between the internal wall of the pipe and the external surface of the internal cathode;
   Ability to increase the aspect ratio for deposition by placing an anode or multiple anodes internal to the interior cathode; and
   The coating of
      Pistons;
      Displacement rods concurrently with cylinders/cylinder liners;
      External threads for anti-galling, electrical isolation, anti-corrosion applications; and
      Large ID pipes by optimizing the pressure regime for a hollow cathode discharge by utilizing a sacrificial center rod/tube as a cathode. This also can be used to control gas flow and pumping requirements for large ID pipes.

Properties of the resulting films deposited by this method can be tailored by controlling the power, duty cycle, waveform, incident ion-energy and by manipulating the voltage and pressure, residence time, and precursor selection and flow. Each of these factors (among others) contributes to the final film chemistry and therefore the resulting properties. The high ion bombardment of the hollow cathode process enables unique plasma chemistries and coating properties on both inner and outer surfaces, in addition to high deposition rate.

The chemical components of the films can include but are not limited to and can be used in many combinations:
   Silicon;
   Germanium;
   Carbon;
   Hydrogen;
   Nitrogen;
   Oxygen; and
   Metallic dopants, such as Ti, Al, Cr, etc.

By changing the combinations of the chemical components of the films and the process conditions, the optical properties of the films can be tailored to create:
   Anti-Reflective Coatings
      To ensure low-to-zero reflectance of incident light, allowing for maximum efficiency in thermal solar applications;
   Highly absorbing coatings for absorbing over any range of wavelengths
      UV and visible light absorption for efficient thermal solar applications;
      IR absorbing for applications in optical sensor/metrology equipment;
   Low permeability, including low hydrogen permeability To prevent disruption of vacuum in housing of thermal solar absorbing pipes from hydrogen loss from heat transfer oils;

Highly absorbing films while limiting the emission;

Hard films for anti-wear and abrasion; and

Ability to layer the film chemistry to achieve stacks to obtain multiple desired properties from one film.

By combining these films into a single stack, one can engineer a film with varied optical properties to create the ultimate thermal solar absorbing film. This can be accomplished by maximizing absorption over the broadest range of wavelengths, while minimizing initial reflectance, using an anti-reflective top coat and a low emission layer to keep the absorbed energy from escaping from the heat transfer fluid while also preventing hydrogen from permeating from the traditional heat transfer fluids and disrupting the vacuum, thus preserving the protection against heat loss from convective heat transfer.

In another embodiment of the invention, two separate power supplies are used to independently bias the inner and outer pipes 10 and 60. This use of separate power supplies can be employed to create materials which cannot be produced with a single power supply arrangement. As an example of a single power supply arrangement and its limitation, if a low bias (less than 100V) is applied to a workpiece using a DC pulse power supply, no plasma will be created, as the voltage is too low to strike and maintain a plasma. Because only one power supply is used to both bias the workpiece and generate the plasma, the minimum bias voltage is limited to the voltage required to maintain a plasma (for example, approximately 500V in an argon plasma and higher voltage for molecular gas). This limits the range of bias voltages that can be applied and also makes the plasma density a function of the bias voltage. Thus, the range of coating properties that can be obtained is limited.

In comparison, the double power supply arrangement may be connected such that one of the pipes is biased at high voltage (greater than 500V) to generate a high density plasma and the second pipe may be biased at a low voltage (less than 100V) to create a high refractive index $sp^3$ polymer that can be used for thermal solar and other applications. Since the properties of coatings are highly dependent on the bias voltage, it is expected that other novel materials can be generated by adjusting the bias voltage between 100V and 3000V. Fundamentally, this arrangement separates the workpiece bias voltage from the independent control of the plasma density.

As a modification of this double power supply arrangement embodiment, the two power supplies can be used in a current (or power) control mode. It should be noted that the current flux density to the outer surface of the inner pipe will be higher than the flux to the outer pipe due to the natural diffusive behavior in a cylindrically bounded system. Also, waste heat will be more difficult to remove from the inner pipe, which may cause the inner surface to run hotter than the outer pipe. This ability to independently control the current (power) to the two workpieces can be used to tune coating properties, and to compensate for this tendency for the outer surface of the inner pipe to run with higher current flux and heat. An additional embodiment includes inserting magnets within the inner tube. This magnetic field can be used to improve film properties such as hardness and deposition rate. Additionally, if the magnetic field is adjusted such that it is stronger near the inner surface and weaker near the outer surface, there will be compensation for the earlier mentioned higher current flux to the inner pipe. It is also possible to control the current or voltage to the two separate workpieces by more cost-efficient means than using two power supplies, such as using passive components such as resistors at 62 in FIG. 1 or a current splitting transformer to control the amount of current flow to each workpiece from a single power supply. Of course, the range of current or voltage will be limited to a fixed ratio of the power supply setpoint with this approach.

The spacing between the inner and outer pipe is significant not only based on establishing the Hollow Cathode Effect (HCE), since it is also important to control the plasma intensity, plasma focusing, heating and the bias voltage. These all play a role in determining the quality of the coating. As the spacing between the outer and inner pipes 10 and 60 is decreased, the intense plasma comes in closer proximity to the workpiece, particularly for outer coatings. This can cause intense ion bombardment and heating (it is believed this is due to the focusing of the plasma into the outer surface of the inner part), which will result in a poor quality coating. On the other hand, if the spacing becomes too large, the voltage will become very high, which can cause poor quality, high graphite DLC due to "thermal spikes" as described below. DLC based coatings rely on ion bombardment energy to form $sp^3$ bonds. Without this, graphite or polymer will form instead of diamond. It has been found that approximately 100 eV of energy on the $C^+$ ion is needed to maximize the $sp^3$ content. This carbon ion energy is a function of bias voltage, pressure, precursor gas and plasma density. Conventional precursors are hydrocarbons, such as methane, acetylene and benzene. Larger precursors typically produce a higher deposition rate due to more carbon atoms per ion delivered to the surface. The precursor used to form the film will change the energy per carbon atom due to the breakup of the molecule on impact with the surface. Thus, a carbon atom produced from acetylene ($C_2H_2$) will have approximately one-half the energy of a carbon atom from methane ($CH_4$). Therefore, a higher bias voltage is required to produce high $sp^3$ content films if large precursor molecules are used.

The use of a high bias voltage can have negative effects, such as a larger thermal spike, which causes the $sp^3$ bond to relax back to graphite or $sp^2$. The formation of prior art DLC films is fully described in "Diamond-Like Amorphous Carbon," J. Robertson, *Materials Science and Engineering* R 37 (2002) pages 129-281; incorporated herein by reference. The commonly accepted model of DLC formation is referred to as the 'subplantation' model. This model states that for hydrocarbon precursors, if the carbon atom arrives with a low energy (below approximately 50 eV), the atom will form a high hydrogen content polymer, and if it arrives with moderate energy (approximately 70 eV-120 eV) it will penetrate below the surface where it is held in compression and forms a or tetrahedral bond. If the energy is increased further, a 'thermal spike' will occur locally, which allows the $sp^3$ bond to relax back to graphite or $sp^2$ bonding. These numbers are approximate for low pressure and $CH_4$ precursor, and will vary based on pressure and precursor size. Some prior art PECVD techniques contain substantial amounts of hydrogen due to the hydrogen contained in the hydrocarbon precursor, which is incorporated into the DLC. This hydrogen has detrimental effects such as lowering the hardness and temperature stability of the coating. Use of higher voltage tends to reduce the hydrogen content of the DLC coating, which has been shown to increase hardness and improve temperature stability.

In one embodiment of the invention voltage is controlled between 500V and 3000V and in a preferred embodiment for high hardness DLC voltage is controlled between 900V and 1500V, at a pressure between 50 mTorr and 300 mTorr with the use of acetylene precursor. Without limiting the invention, it has been found empirically that the value for the inner diameter (i.d.) or the outer "chamber" can be found using the following formula: i.d. (outer chamber)=1.46×(o.d. inner part)+1.53. Examples of "best fit" values are shown below for a 12" (30.48 cm) long inside part:

| Outside diameter (o.d.) of inner tube | Inside diameter (i.d.) of outer tube |
|---|---|
| 3.81 cm | 9.8425 cm |
| 7.62 cm | 15.24 cm |

It is also particularly important for outer hollow cathode coatings to control the temperature of the workpiece. Outer diameter coatings should be run at lower power and temperature compared to interior hollow cathodes as disclosed for example in the above-referenced patent to Boardman et al. Power is scaled with the surface area of the cathode (both the inner part and the outer chamber). In an embodiment of this invention, the DC pulsed power supply is run in current or power control mode and the power is set so that the temperature of the outer chamber (which can be monitored with an IR sensor) is in the range of 95 C-235 C. If the temperature goes outside of this range, the coating quality will be poor, with effects such as graphite formation, soot or powder formation, and particularly delamination. Excess temperature can cause high stress in the coating due to thermal expansion mismatch, while low temperatures can cause problems such as gas phase nucleation and powder formation, particularly in the silicon containing layers. In a preferred embodiment, the outer temperature is controlled to 149 C-179 C. This power level is typically 10-20 percent lower than would have been obtained from prior art inner diameter coatings. This results in lower deposition rate and higher hardness. It should be noted that compared to chamber based, prior art outer coatings the deposition rate is still almost a factor of ten higher, enabling many new applications. The voltage can be increased to the desired range by controlling the spacing, to provide a high hardness DLC top layer. For prior art inner, HCE, DLC coatings the part was heated rapidly at high power and low pressure using a high duty cycle DC pulse waveform, for outer HCE DLC, coatings the part must be heated more gradually at higher pressure and low power. Without limiting the invention, a table of differences between prior art hollow cathode, inner coatings and this outer coating invention is shown below:

| Process | Temp (C.) on outer surface | DC Power (w/cm2) | Voltage | Hardness (GPa) | Dep rate (microns/min) |
|---|---|---|---|---|---|
| Outer surface | 149-177 | 0.33 | 900-1200 | 15-16 | 0.2 |
| Prior art inner surface HCE coating | 177-204 | 0.26 | 800-1000 | 10-12 | 0.3 |

The process is also controlled by length of both the inner and outer part. There is an upper limit to the aspect ratio (length/spacing) that can produce a stable HCE. It is believed this is due to the impedance of the plasma itself. As the distance between the remote anode and the most distant part of the cathode increases (in the case of an anode on each end of a pipe this is the center of the pipe cathode), the distance that an electron must travel increases, which effectively increases the impedance seen from the center of the pipe. This effect causes low plasma intensity at the center relative to the ends. This upper limit is approximately 50:1. After this ratio is exceeded, additional anodes may be inserted into the outer pipe at the required spacing intervals. It has been found that uniformity can be improved and voltage better controlled (which has a direct effect on coating hardness) by reducing the length of the inner pipe with respect to the outer pipe. For example if a rod of length L is being coated on the outer surface, a pipe of length 2L should be used for the outer chamber with the part centered in the middle of the "chamber". This improves the uniformity of the coating as this allows equilibrium to be established for plasma intensity and gas activation and heating, as all these processes are initiated at the entrance of the first hollow cathode, which is established within the inner diameter of the outer "chamber". For example, if a 3 inch (7.62 cm) diameter×12 inch (30.48 cm) long part is being coated, a 6 inch (15.24 cm) inner diameter chamber that is 24 inches (60.96 cm) long is used. There is now a first "stabilization" hollow cathode plasma established in the 15.24 cm diameter space at the ends and a second deposition plasma established in the 3.5 inch (8.89 cm) space between the inner part and outer chamber. This has advantages besides uniformity improvement, as it also allows better voltage control, because the large 6 inch (15.24) space at the ends will drive the plasma voltage higher, producing a harder coating.

What is claimed is:

1. A method of coating at least one exterior surface of at least one workpiece comprising:
   providing a chamber having a multi-dimensional interior surface with a particular geometry with respect to an axis of said chamber;
   positioning said at least one hollow workpiece within said chamber such that a spacing between said multi-dimensional interior surface and said at least one exterior surface remains substantially fixed along an axial direction; and
   establishing conditions to maintain a hollow cathode effect within said spacing between said interior surface and said at least one exterior surface and within said hollow workpiece, thereby defining a hollow cathode effect region, said conditions including biasing anodes at opposite ends of said hollow cathode effect region and including biasing said interior surface and each said workpiece as cathodes, wherein establishing said conditions further includes pressurizing plasma residing within said spacing.

2. The method of claim 1 wherein said biasing includes maintaining said interior surface and each said workpiece at a common bias voltage.

3. The method of claim 1 wherein providing said chamber includes defining said particular geometry so as to have a circular cross section, said axis of said chamber extending perpendicular to said circular cross section.

4. The method of claim 3 wherein positioning said at least one workpiece includes centering each said workpiece along said axis.

5. The method of claim 1 wherein providing said chamber and positioning said at least one workpiece include selecting a distance between said interior surface and said at least one exterior surface on a basis of achieving target coating properties of said coating.

6. The method of claim 5 wherein selecting said distance includes at least partially basing a selection on controlling plasma intensity proximate to each said exterior surface on which said coating is formed, thereby controlling localized heating which affects said coating properties.

7. The method of claim 5 wherein selecting said distance includes at least partially basing a selection on achieving said hollow cathode effect at bias voltages which promote achievement of said target coating properties.

8. The method of claim 1 wherein said biasing includes applying power on the basis of achieving target coating properties of said coating, including selecting applied power from within a range of power parameters that enables maintenance of said hollow cathode effect while achieving target coating parameters.

9. The method of claim 1 wherein providing said chamber includes defining said particular geometry of said interior surface as being cylindrical and wherein said at least one exterior surface to be coated defines a cylindrical shape that is coaxial with said interior surface.

10. The method of claim 9 wherein said at least one workpiece is a tube having a tube interior and wherein establishing said conditions to maintain said hollow cathode effect is simultaneously applied within said tube so as to coat said interior of said tube.

11. The method of claim 10 wherein said tube interior has a diameter corresponding to a distance of said spacing.

12. A method for enabling coating comprising:
providing a chamber which defines an enclosed area along an axial region;
positioning a hollow conductive member within said enclosed area so as to be coaxial with said axial region;
supplying a reactive gas within spacing between said chamber and said conductive member and within an interior of said hollow conductive member; and
establishing conditions for a hollow cathode effect along said enclosed region including within said interior of said hollow conductive member and between an interior surface of said chamber and an exterior surface of said hollow conductive member so as to generate a high energy plasma that includes coating material to be deposited, said conditions including maintaining a cooperative arrangement of pressure and biasing for achieving said hollow cathode effect, wherein establishing said conditions includes biasing anodes at opposite open ends of said hollow conductive member.

13. The method of claim 12 wherein positioning said conductive member includes locating a tubular member within said chamber having a tubular shape and wherein said conductive member and said chamber are biased as cathodes.

14. The method of claim 12 wherein establishing said conditions includes controlling a ratio of a distance between said anodes to a distance across said spacing, thereby affecting properties of a coating.

15. The method of claim 12 further comprising applying an asymmetric bipolar pulse to said chamber and said conductive member, including applying a short positive pulse to said conductive member between applying negative pulses so as to dissipate accumulation of positive charge without reversing said high energy plasma.

16. A method of coating at least one exterior surface of at least one workpiece comprising:
providing a chamber having a multi-dimensional interior surface with a particular geometry with respect to an axis of said chamber;
positioning said at least one workpiece within said chamber such that a spacing between said multi-dimensional interior surface and said at least one exterior surface remains substantially fixed along an axial direction; and
establishing conditions to maintain a hollow cathode effect within said spacing between said interior surface and said at least one exterior surface, thereby defining a hollow cathode effect region, said conditions including biasing anodes at opposite ends of said hollow cathode effect region and including biasing said interior surface and each said workpiece as cathodes, wherein establishing said conditions further includes pressurizing plasma residing within said spacing;
wherein establishing said conditions includes biasing said interior surface of said chamber as a cathode having a bias voltage that is different than a bias voltage applied to each said workpiece.

17. A method of coating at least one exterior surface of at least one workpiece comprising:
providing a chamber having an interior surface with a cylindrical geometry with respect to an axis of said chamber;
positioning said at least one workpiece within said chamber such that a spacing between said interior surface of said chamber and said at least one exterior surface remains substantially fixed along an axial direction, wherein said at least one exterior surface to be coated defines a cylindrical shape that is coaxial with said interior surface and wherein said at least one workpiece includes a tube having a tube interior and wherein establishing said conditions to maintain said hollow cathode effect is simultaneously applied within said tube so as to coat said interior of said tube; and
establishing conditions to maintain a hollow cathode effect within said spacing between said interior surface and said at least one exterior surface, thereby defining a hollow cathode effect region, said conditions including biasing anodes at opposite ends of said hollow cathode effect region and including biasing said interior surface and each said workpiece as cathodes, wherein establishing said conditions further includes pressurizing plasma residing within said spacing;
wherein materials applied to coat said tube interior and said exterior surface are different.

* * * * *

UNITED STATES PATENT AND TRADEMARK OFFICE
CERTIFICATE OF CORRECTION

PATENT NO.       : 8,343,593 B2
APPLICATION NO.  : 12/465494
DATED            : January 1, 2013
INVENTOR(S)      : William J. Boardman et al.

It is certified that error appears in the above-identified patent and that said Letters Patent is hereby corrected as shown below:

In the Specification

Column 8, lines 48 - 49 should read:

"held in compression and forms a $sp^3$ or tetrahedral bond. ..."

Signed and Sealed this
Twenty-fifth Day of June, 2013

Teresa Stanek Rea
*Acting Director of the United States Patent and Trademark Office*